United States Patent
Cadet et al.

[11] Patent Number: 5,926,379
[45] Date of Patent: Jul. 20, 1999

[54] ELECTRONIC CARD ASSEMBLY BY MEANS OF SOLDER CONNECTIONS

[75] Inventors: Yves Cadet, Osny; André Tutka, Argenteuil, both of France

[73] Assignee: Sagem Sa, Paris, France

[21] Appl. No.: 08/758,744

[22] Filed: Dec. 6, 1996

[30] Foreign Application Priority Data

Dec. 7, 1995 [FR] France .................................. 95 14497

[51] Int. Cl.$^6$ ...................................................... H05K 1/14
[52] U.S. Cl. ........................ 361/803; 361/737; 361/743; 361/768; 257/686; 257/724; 174/263; 29/831; 29/839
[58] Field of Search ..................................... 361/736, 737, 361/743, 768, 803, 767, 784; 228/180.22; 439/69, 74, 83; 29/831, 837, 839; 174/262, 263; 257/686, 723, 724, 778

[56] References Cited

U.S. PATENT DOCUMENTS

| | | | |
|---|---|---|---|
| 4,074,342 | 2/1978 | Honn et al. ............................... | 29/831 |
| 4,803,595 | 2/1989 | Kraus et al. ............................. | 361/784 |
| 5,313,366 | 5/1994 | Gaudenzi et al. ...................... | 361/767 |
| 5,354,955 | 10/1994 | Gregor et al. .......................... | 174/262 |
| 5,426,566 | 6/1995 | Beilstein, Jr. et al. ................. | 257/686 |
| 5,477,933 | 12/1995 | Nguyen .................................. | 361/768 |
| 5,535,526 | 7/1996 | White .................................. | 228/180.22 |
| 5,715,144 | 2/1998 | Ameen et al. .......................... | 361/803 |

FOREIGN PATENT DOCUMENTS 4326104  2/1995  Germany ......................... H05K 1/14

OTHER PUBLICATIONS

Motorola Technical Developments, vol. 14, Dec. 1991, Schaumburg, Illinois, U.S. pp. 27–28, XP000276140, K.P. Gore et al.: "Mechanical alignment of C5 ICs with three corner peg concept using larger solder spheres". (Whole document).

*Primary Examiner*—Leo P. Picard
*Assistant Examiner*—John B. Vigushin
*Attorney, Agent, or Firm*—Marshall, O'Toole, Gerstein, Murray & Borun

[57] ABSTRACT

A unitary assembly of electronic cards has a base printed card carrying electronic microcomponents having outputs distributed at a first pitch and at least one core printed card having a size smaller than that of the base printed card, carrying microcomponents. Some at least of the microcomponents have outputs distributed at a pitch smaller than the first pitch. Several electrically conductive solder beads, distributed according to a two-dimensional array, mechanically and electrically connect the core printed card and the base printed card.

10 Claims, 1 Drawing Sheet

ELECTRONIC CARD ASSEMBLY BY MEANS OF SOLDER CONNECTIONS

BACKGROUND OF THE INVENTION

The present invention relates to a unitary assembly of electronic cards fitted with microcomponents, comprising a base printed circuit card carrying microcomponents and at least one additional card secured thereto, said additional card being smaller in size than the base card and likewise carrying microcomponents.

Numerous consumer appliances are controlled by printed circuit cards carrying electronic microcomponents. The continuing increase in the number of functions that such appliances need to perform has given rise to an increase in the number of microcomponents that are required, and thus to the area necessary for carrying them. Such microcomponents are of varying kinds. Some components have terminal pads distributed at a pitch that is much smaller than the spacing between pads of other kinds of component. When such components are all fixed on the same card, the manufacturing accuracy required for the card is determined by the pitch of the pads of the most difficult components. However, any increase in accuracy gives rise to an increase in the cost of making a card, and that is particularly true when the card is large in size. The cost of cards for use in consumer appliances must be very low, which implies both low manufacturing cost and low reject rate.

SUMMARY OF THE INVENTION

An object of the present invention is to provide a unitary assembly of electronic cards apt to replace a single card; it is a more specific object to provide a card which makes it possible to achieve lower cost for the same function as prior art cards.

To this end, there is provided a unitary assembly of cards comprising a base printed card carrying electronic microcomponents having outputs distributed at a first pitch and at least one core printed card having a size smaller than a size of the base printed card, carrying microcomponents some at least of which having outputs distributed at a second pitch, smaller than said first pitch. A plurality of electrically conductive solder beads distributed according to a two-dimensional array, mechanically and electrically connect said core printed card and said base printed card.

The base card and the core card use different technologies and materials: in particular, the base card may have low integration density on a substrate that optionally includes fiberglass cloth, while the core or "piggy back" card has higher integration density on an epoxy substrate with fiberglass.

The core card, which frequently has high interconnection density (e.g. of class 5), is designed to receive components having terminals at a small pitch (typically 0.5 mm). It may optionally also carry passive components. It is often small in size and deformation thereof during manufacture therefore constitutes little problem. The base card having lower interconnection density may be of larger size, e.g. 230 mm×130 mm. The connections via beads serve to avoid making connections between the cards by means of a sheet of conductors in which individual wires must be separated by at least ½₀th of an inch (1.27 mm) when using presently-available technology.

To ensure that the core card is accurately centered on the base card without requiring elements that need additional operations, solder pellets or pegs secured to the core card can be provided facing holes in the base card so as to engage in said holes during an overall reflow soldering operation that takes place during manufacture. For this purpose, it is possible, in particular, to dispose large diameter beads at the periphery of the bottom portion of the core card, thereby ensuring mechanical positioning and support throughout the method. This system of engaging beads in holes ensures stability during the stages in which the component face is silkscreen printed, the components are put into place, and cards are moved between successive machines.

The assembly may include a plurality of core cards instead of a single core card; in addition it may include one or more macrocomponents fixed to the core card and/or to the base card.

The beads for providing mechanical connection and electrical connection between the core card and the base card may be of a diameter that is greater than the thickness of components mounted on the surface of the base card. If the beads are in the central portion of the core card, surface mounted microcomponents can then be placed on the base card, under lateral portions of the core card, thereby making it possible to further increase the number of components mounted in the assembly.

The invention also intends to provide a method for manufacturing an assembly of the above-defined kind, suitable for implementation on a continuous manufacturing line without any branches, thereby reducing cost.

For that purpose, there is provided for manufacturing a unitary assembly of electronic cards, comprising the steps of:

(a) during a same manufacturing phase, silk printing brazing cream on contact pads of a base printed circuit card, with a first distribution spacing of contacts apt to receive microcomponents and silk printing brazing cream on contact pads formed on a major surface of a core printed circuit card with said spacing of the contact pads thereof, for constituting brazing beads, said core printed circuit card having a size smaller than that of the base printed circuit card and being carried by a same support plate;

(b) securing microcomponents on the base printed circuit card and on the core printed circuit card on an automatic machine, (c) locating and centering said core printed circuit card on said base printed circuit card to form an assembly; and (d) heating the assembly obtained by step (c) to a temperature sufficient for reflow soldering and brazing.

The method makes it possible to simplify manufacture since the base printed circuit and the core card can be placed on a common carrier tray and can be silkscreen printed during the same manufacturing stage in a single pass, using a single manufacturing line.

During step a), lead-tin solder beads are obtained that enable interconnections to be achieved between core and base cards after a reflow operation that can itself be performed in a tunnel oven performing a calibrated temperature cycle.

The above characteristics will appear more clearly together with others on reading the following description of a particular embodiment given by way of non-limiting example. The description refers to the accompanying drawings.

DETAILED DESCRIPTION

Figure 1:
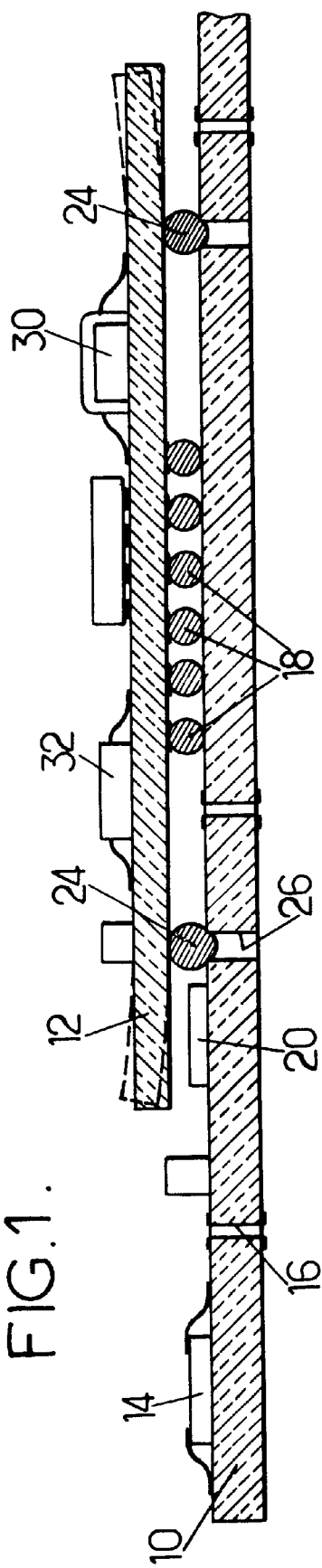
FIG. 1 is a diagrammatic section view, not to scale, showing an assembly comprising a single core card on a base card.

The unitary assembly shown diagrammatically in FIG. 1 comprises a base card 10 and a core card 12 of smaller size fixed to the base card.

The base card 10 may be large in size, and is made using a technology that does not accommodate the same component density as the core card. By way of example, the base card 10 may be constituted by fiberglass-reinforced epoxy resin, in class 3, making it possible to use conventional technologies of silkscreen printing and photoresist, with tracks having a thickness of 310 microns, and at a separation of 310 microns, suitable for receiving surface-mounted microcomponents 14 and also macrocomponents, optionally via plated-through holes 16 or vias. In general, the base card will have a conventional thickness of 1.6 mm.

The core card may be made using class 5 technology, and will generally be thinner than the base card. In particular it may be constituted by epoxy embedded glass cloth with crossed fibers to a thickness of not than 0.8 mm. In class 5, it is possible to make tracks and areas for receiving terminals of microcomponents that are distributed at a pitch of 0.5 mm.

Electrical connections between the base card 10 and the core card 12 are achieved via beads of solder material 18 placed between the cards. The beads are advantageously provided in a central portion of the core card in a two-dimensional array, so as to reduce mechanical stresses. There may be a large number of them, for example they may be distributed in six rows of 20 beads each with a spacing between rows and between beads of 2 mm. An initial diameter for the beads that has given good results is 1 mm, leading to a distance between bonded-together cards lying in the range 0.5 mm to 0.8 mm after reflow soldering. The beads may be constituted, in particular, by a tin-lead alloy having 2% silver.

Such a gap exceeding 0.6 mm makes it possible, if necessary, to receive thin flat components 20 beneath the peripheral portions of the core card. Deformation of the core card can only lead to its edges being raised, so fixing microcomponents having a thickness of 0.2 mm does not raise any problem, and such components are now available.

To limit the mechanical stresses applied to the electrical connection beads 18, the core card 12 is fixed to the base card 10 by additional beads of solder or brazing material 24 disposed around the beads 18. There are only a few such additional beads, e.g. three or four. In the example shown in FIGS. 1 and 2, they serve not only to fix the core card 12, but also to center it accurately relative to the base card 10. For this purpose, holes 26 of a diameter smaller than the initial diameter of the beads 24 are formed through the base card 10. They perform centering when the core card 12 carrying its beads is put into place, as shown by dashed lines in FIG. 2. In the final assembly they provide a strong connection. Reflow soldering causes the beads 24 to penetrate in part into the holes 26, as shown by solid lines in FIG. 2.

When using beads 18 having an initial diameter of 0.7 mm, it is possible to use mechanical fixing beads 24 with an initial diameter of 1.35 mm that are designed to be engaged in holes having an initial diameter of 0.75 mm. More generally, the initial diameter of the mechanical fixing means 24 is considerably greater than that of the electrical connection beads 18.

Figure 2:
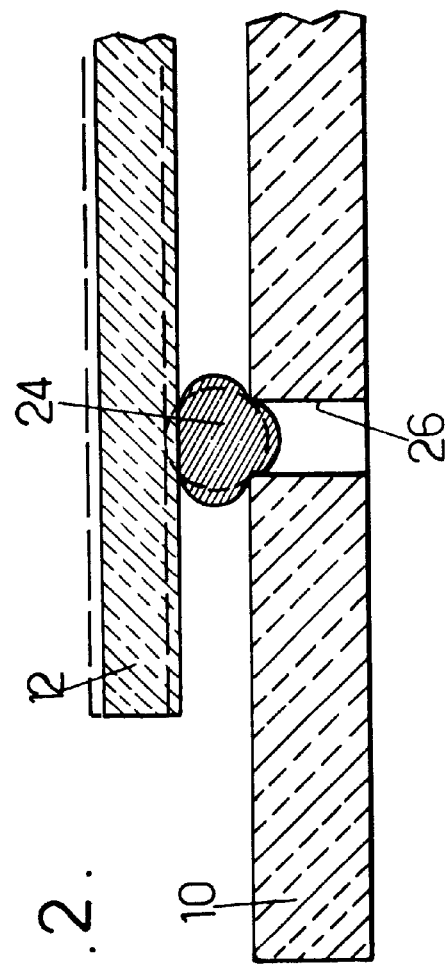
FIG. 2 is a detail view on a larger scale showing a centering pellet before and after reflow soldering.

Referring to FIG. 2, the mechanical connection beads 24, after reflow soldering, constitute solder pellets engaged in the holes 26, providing power supply connections, and also limiting deformation of the core card.

A possible method of mass manufacture of unitary assemblies is described below.

The core cards 12, e.g. of dimensions 64 mm×87 mm, may be made in batches each occupying a portion of a panel of 300 mm×400 mm glass-epoxy laminate. The patterns on the face that is to receive the components are etched successively by means of a step-and-repeat machine. A thin layer of tin-lead solder is applied to the areas that are to receive the contacts of the components. On the other face, a brazing paste is deposited by silkscreen printing on the locations of the electrical connection beads 18 and of the mechanical connection beads 24, in quantities sufficient to ensure that beads of the desired diameter are subsequently obtained. The panel is subjected to a reflow soldering cycle which causes the beads to be formed under the effect of surface tension. The panel can then be cut up into core cards 12 ready for fitting to respective base cards. This can be done by means of a machine of the same kind as that used for installing electronic components, given the small dimensions of the core card.

The base cards are made conventionally, on a machine that does not provide the same degree of accuracy as that required by the core cards.

Each core card can be fitted to a corresponding base card by means of a machine which is fed by a conveyor that brings the base card and the core card to the machine simultaneously. Each base card and core card pair can be placed on a tray having cells for receiving the mechanical link beads 24, thereby guaranteeing accurate positioning and proper grasping of the core card by the grasping member of the machine. Microcomponents are fixed to both cards, generally by adhesive, in operations that may be performed sequentially on two different machines of appropriate accuracies. Thereafter, the core card fitted with its components is placed and centered on the base card. Finally, the assembly is heated to a reflow temperature in an inert atmosphere in order to make the electrical and mechanical connections. This technology can be implemented without cleaning the cards.

In a modified embodiment, only the bottom faces of the core cards are prepared prior to being cut up, and the two cards that are to constitute a single assembly are etched and silkscreen printed while they are both on the same tray, but using two successive machines working to different accuracies.

As mentioned above, further variants are also possible. The core card may receive not only surface-mounted components 32, but also macrocomponents 30 coated in plastics material and so-called "QFP" components. The method may be adapted to double-sided technology.

We claim:

1. Unitary assembly of electronic cards, comprising:
   a base printed card,
   electronic mircomponents having outputs distributed at a first pitch and electrically connected to said base printed card,
   at least one core printed card having a size smaller than a size of the base printed card, carrying mircomponents at least some of which having outputs distributed at a second pitch, smaller than said first pitch,
   a plurality of electrically conductive solder beads distributed according to a two-dimensional array, mechanically and electrically connecting said core printed card and said base printed card, and a plurality of components located under the core card and secured to the base printed card.

2. Unitary assembly of electronic cards, comprising:

a base printed card having contacts distributed in a two dimensional array with a first pitch, a plurality of electronic microcomponents having outputs distributed at said first pitch and directly electrically connected to some of said contacts of said base printed card, at least one core printed card having a size smaller than a size of the base printed card, carrying microcomponents at least some of which having outputs distributed at a second pitch, smaller than said first pitch, and a plurality of electrically conductive solder beads distributed according to a two-dimensional array, mechanically and electrically connecting said core printed card, directly to others of said contacts of said base printed card said electrically conductive solder beads being located only in a central portion of a major surface of said core printed card.

3. Unitary assembly according to claim 2, further comprising at least one QFP microcomponent secured to the core printed card.

4. Unitary assembly according to claim 2, further comprising a plurality of microcomponents located under a peripheral portion of the core card and secured to the base printed card.

5. Unitary assembly according to claim 2, wherein said base printed card and said core printed card are constituted of mutually different materials.

6. Unitary assembly according to claim 2, further comprising a plurality of solder pellets engaging into holes formed through the base printed card and distributed on a peripheral portion of said core printed card around said electrically conductive beads.

7. Unitary assembly of electronic cards, comprising:

a base printed card having contacts distributed in a two dimensional array with a first pitch, a plurality of electronic microcomponents having outputs distributed at said first pitch and directly electrically connected to some of said contacts of said base printed card, at least one core printed card having a size smaller than a size of the base printed card, carrying microcomponents at least some of which having outputs distributed at a second pitch, smaller than said first pitch, a plurality of electrically conductive solder beads distributed according to a two-dimensional array, mechanically and electrically connecting said core printed card directly to others of said contacts of said base printed card, and a plurality of solder pellets engaging into holes formed through the base printed card.

8. Unitary assembly according to claim 7, wherein three or four said solder pellets are distributed in a peripheral portion of said core printed card.

9. Unitary assembly according to claim 7, wherein said pellets are formed from solder beads having a diameter higher than a diameter of the electrically conducting solder beads.

10. Unitary assembly according to claim 7, further comprising a plurality of microcomponents located under the core card and secured to the base printed card.

* * * * *